United States Patent
Kehr et al.

(10) Patent No.: US 6,486,501 B1
(45) Date of Patent: Nov. 26, 2002

(54) COMPONENT WITH RECTIFYING FUNCTION, FULFILLED BY MEANS OF CHARGE TRANSPORT BY IONS

(75) Inventors: Klaus W. Kehr, Düren (DE); Kiaresch Mussawisade, Köln (DE); Thomas Wichmann, Köln (DE); Ulrich Poppe, Düren (DE)

(73) Assignee: Forschungszentrum Julich GmbH, Julich (DE)

( * ) Notice: Subject to any disclaimer, the term of this patent is extended or adjusted under 35 U.S.C. 154(b) by 0 days.

(21) Appl. No.: 09/485,404
(22) PCT Filed: Aug. 5, 1998
(86) PCT No.: PCT/DE98/02292
§ 371 (c)(1), (2), (4) Date: Feb. 7, 2000
(87) PCT Pub. No.: WO99/08327
PCT Pub. Date: Feb. 18, 1999

(30) Foreign Application Priority Data

Aug. 6, 1997 (DE) .......................... 197 33 921

(51) Int. Cl.$^7$ ............................... H01L 29/74
(52) U.S. Cl. ................. 257/119; 257/120; 438/134
(58) Field of Search .................... 257/528, 46, 43, 257/119, 120, 31–36; 438/134

(56) References Cited

U.S. PATENT DOCUMENTS 6,157,044 A * 12/2000 Nakanishi et al. ............ 257/33

FOREIGN PATENT DOCUMENTS

| EP | 0 105 993 A1 | 4/1984 |
| EP | 0 108 179 A1 | 5/1984 |
| WO | WO 88/04108 | 6/1988 |

OTHER PUBLICATIONS

Shimura et al., "Electrochemical properties of junction between protonic conductor and oxide ion conductor", Solid State Ionics, pp 477–482, 1977.*

Electrochemical Properties of Junction Between Protonic Conductor and Oxide Ion Conductor by T. Shimura et al. Solid Stae ionics 97 (1997) 477–482.

* cited by examiner

*Primary Examiner*—Steven Loke
*Assistant Examiner*—Donghee Kang
(74) *Attorney, Agent, or Firm*—Herbert Dubno

(57) ABSTRACT

The invention relates to a component having a rectifying function, fulfilled by means of charge transfer by ions. To this end, the component is composed of multiple layers which have, successively, an asymmetric energy level course, and an electric field applied to these multiple layers.

7 Claims, 2 Drawing Sheets

COMPONENT WITH RECTIFYING FUNCTION, FULFILLED BY MEANS OF CHARGE TRANSPORT BY IONS

CROSS REFERENCE TO RELATED APPLICATIONS

This application is a national stage of PCT/DE98/02292 filed Aug. 5, 1998 and based under the international convention on German national application 197 33 921.2 filed Aug. 6, 1997.

FIELD OF THE INVENTION

The invention relates to a component with rectifying function using ion charge transport. More particularly the invention relates to rectifiers for particles which use especially thin layers in solids or thin membranes.

BACKGROUND OF THE INVENTION

It is known as state of the art to form rectifiers for electrons on a semiconductor basis. They are well known and described in textbooks in semiconductor physics and semiconductor technology. In the technical literature in the last years, proposals have been made for rectifiers for ions which are analogous to the rectifiers for electrons on a semiconductor basis. In laboratory tests, the rectifying effect can be detected.

OBJECT OF THE INVENTION

It is an object of the invention to provide a component with a rectifier function using ion charge transport with which can achieve the ion transport in other ways than are known in the art.

SUMMARY OF THE INVENTION

These objects are achieved with a component with a rectifier function with the aid of ion charge transport which has a layer stack of a multiplicity of layers which follow one another and form an asymmetrical course of the energy level and wherein an electric field is applied to this stack.

The following should be noted:

The component according to the invention with this rectifier function rests on other principles than those described as known above for rectifiers for ions. The basis of the component of the invention forms an exact theory of nonlinear mobility of particles in potentials without inversion symmetry. The component of the invention, however, can be described without this mathematical description.

The mobility of the ions/particles based upon atomic hop processes from one potential minimum to another potential minimum is involved. The potential for particles can have the shape of a staircase, whereby from the last step there is a sharp drop to the starting level. The mobility of particles in the hop process under the influence of a force is the same in both directions for small forces. This corresponds to the ohmic case in electrical transport. For very strong forces in one direction, the mobility due to the inverse of the mean of the inverse jump rate determines the corresponding direction. The means of the inverse jump rate all of which are the same ("upward staircase") is much smaller than the means of the inverses of a very small and multiple size jump rate (each staircase). As a consequence the mobility as inverses of both of these means has a large step up and under a strong force and is small in the downward stepping direction. The here given clarification depends upon one dimensional potential which can possibly be realizable even in channels in membranes. They can however transition to three-dimensional layer structures when the layers are uniform in directions perpendicular to the movement direction.

It has been found to be advantageous to form the component according to the invention as a stack of multiple layers which collectively and one after the other contribute an asymmetric course to the energy level and also in which an electric field is applied to this layer stack.

Advantageously, a multiplicity of successive layer stacks is provided.

In an especially advantageous manner, one or more layers of the layer stack, especially all layers are constructed from a monolayer.

In another feature of the invention the component of the invention is configured highly advantageously with an asymmetric energy level course so that in the successive layers, each layer has an energy level which does not fall below the energy level of the preceding layer and so that the energy level from layer to layer increases in value. In this manner, a rectifying function is positively influenced.

The component of the invention for formation of the layer stack, can be made of semiconductive material. It is, however, foreseeable to provide another material for formation of the layer stack or its layers.

The above depicted potentials according to the invention are realized by the application of monoatomic layers of different atom types. Advantageously or preferably one can select the materials for optimization of selected boundary conditions as a function of the potential structures of certain materials. Another advantageous embodiment of the components according to the invention involves the formation of channels in selected membranes.

The component according to the invention with the proposed rectifier function can be used in the field of sensor technology. In this case, certain particles are driven through a barrier layer which cannot be overcome in the reverse direction by them. Advantageously with the components of the present invention, switching effects are obtained by a change in time of the forces. In dependence upon the formation of the layer structure with corresponding lateral extents, it can be advantageous to also transport large quantities of ions/particles.

The rectifying effect for particles, especially ions, obtained in accordance with the invention in layer structures or membranes is based upon the exploitation on non-inversion-symmetrical potential courses as well as the use of relatively strong forces upon the particles such that one operates in the non-linear ranges of the mobility of the particles, especially ions.

Uniform layer structures can be produced, for example, by means of molecular beam epitaxy (MBE) techniques.

SPECIFIC DESCRIPTION

Figure 1:
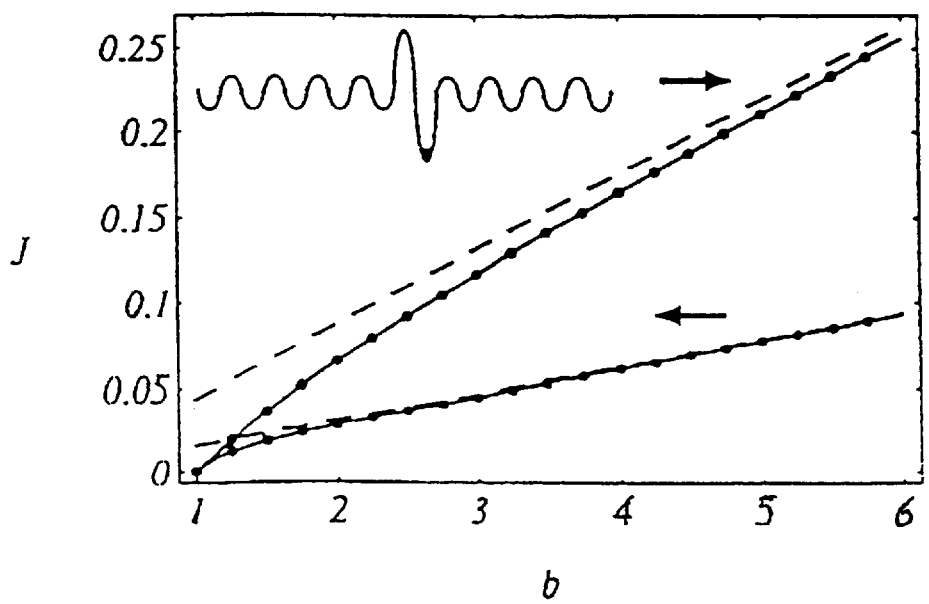
FIG. 1 is a graph illustrating the invention.

In FIG. 1, a model with Schwoebel barriers with N=10 locations has been shown with the particle C-J plotted as a function of the bias b (see inset). The relative hop rates to the right are $e^{-2}$ at the barriers and away from the traps, the rate from the trap to the left is $e^{-4}$. The points indicate simulations, the solid lines, the complete theory and the dashed lines the asymptotic theory.

Figure 2:
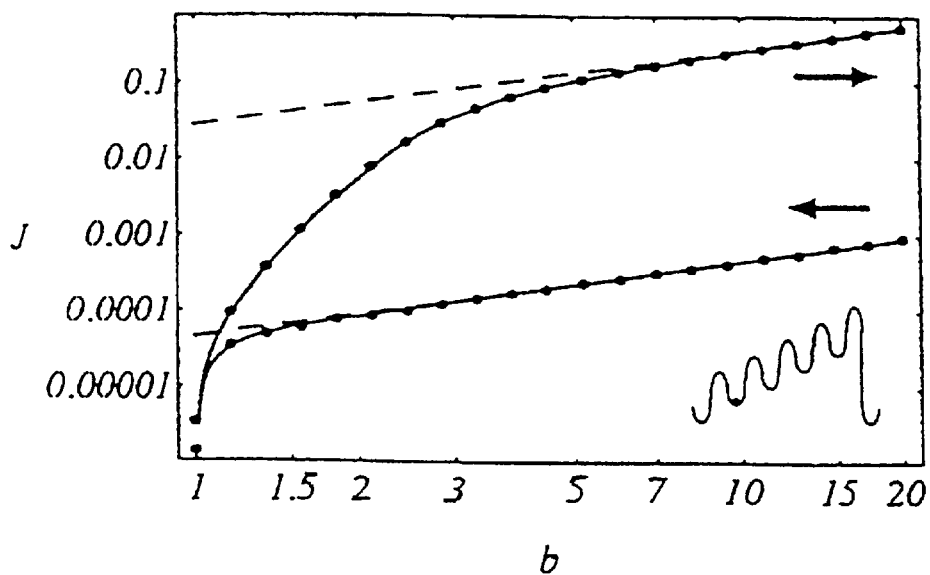
FIG. 2 is another graph.

In FIG. 2 the particle C-J is shown as a function of the bias b in a staircase model with N=5 locations. The relative hop rate has a value of $e^{-2}$ to the right and the relative hop rate to the left over the barrier amounts to $e^{-10}$. The points indicate simulations, the full lines the full theory and the dashed lines the asymptotic theory.

Figure 3:
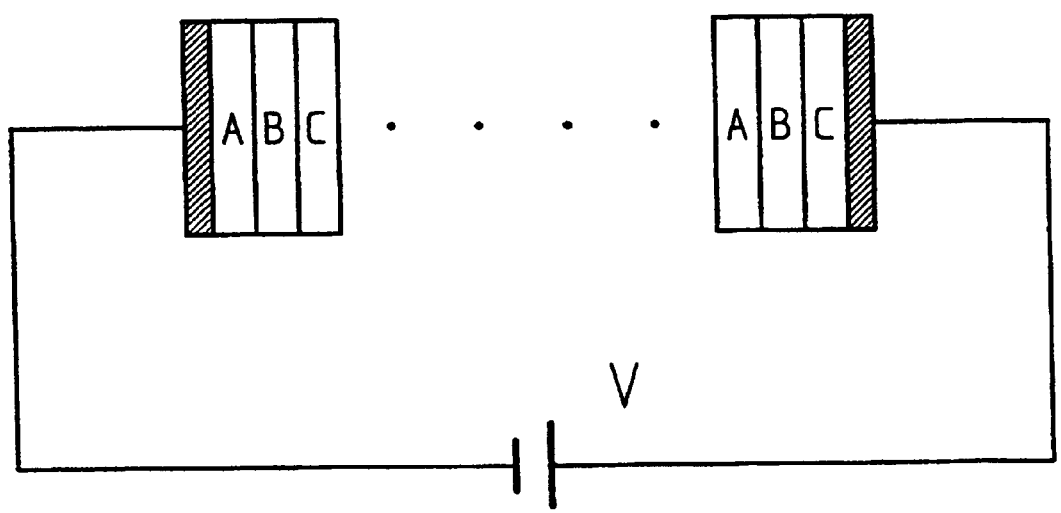
FIG. 3 is a diagram of the component and the source of the electrical fields.

The component according to the invention can be constructed as solid layers and electrodes. The material classes for the solid layers can include all solid materials which also have been described for fuel cells, especially perovskites. What is important, however, is that they must be treated as electronic insulators. The transport currents are those of the ions, especially hydrogen (H) and oxygen (O). The component is constructed as shown in connection with the diagram in FIG. 3 as follows.

The component has periodically repeating layer sequences of three different layers A, B, C, whose characteristics are described below. For the purposes of the invention it is sufficient that a single layer sequence is selected. In practical cases, multiplicities of layer sequences are advantageous. The thicknesses of the individual layers A, B and C should however be respectively at least several atomic monolayers. Such layers can be produced for example by MBE techniques or by sputtering. The determination of the layer thickness requires investigation for optimization of the components.

Figure 4:
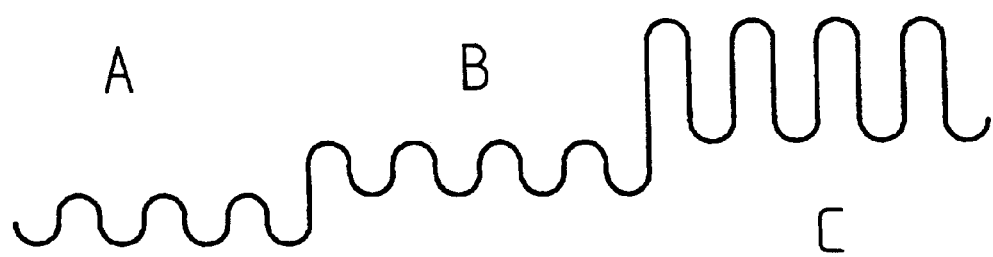
FIG. 4 is a diagram of a potential course.

Via the electrodes, a voltage is applied. The electrodes are comprised of a porous material which is permeable for the respective ion type, like, for example, porous platinum. Such electrodes are for example known from the field of fuel cell technology. The voltages can lie in a range of up to 0.05 V(nm)$^{-1}$. It is important for the desired rectifier function of the component to provide a potential course for the respective ions as shown in principle in FIG. 4 in a direction perpendicular to the layers A, B and C of FIG. 3.

The potential troughs correspond to the equilibrium energies of the ions while the potential crests illustrate barriers for the diffusion hops. It is known that the troughs in different materials have different depths. As specific examples of materials, for example the proton conductors $SrTiO_3$, $SrCeO_3$, and $SrZrO_3$ are mentioned and these can be for example doped with $Y_2O_3$ and then can pick up water vapor which incorporates (OH) ions. The solubility heat for water vapor varies between −2 eV in the first system and −0.5 eV in the third system; it is a measure of the depths of the potential troughs. The diffusion barriers vary between about 0.6 eV (first and second system) and 1.2 eV (third system) the rectifier effect arises when a layer sequence according to the invention is constructed from these three materials. These materials are however given here only as examples for many other combinations. It should be mentioned that repetitive sequences of discrete layers of the three materials are not absolutely necessary and one can also provide a continuous alloying layering between at least two systems which, in the above mentioned examples, can be alloying layers of $SrTiO_3$ to $SrZrO_3$.

A possible use of the component is as an eraseable nonvolatile memory element. The state "0" is the state in which the ions are found on one side of the condenser, the state "1" being that on which they are on the other side. The advantage of the rectifier function is that the information can be inscribed with relatively low voltage, while for erasing an opposite, higher voltage is required.

The invention and the component according to the invention is described in detail in the following information.

The mobility of particles in nonsymmetrical potentials under the influence stochastic forces is of considerable real interest on various grounds. One problem is on understanding of the conditions under which directed movement of particles can arise. Apparently there is a connection between this problem and the second principle of thermodynamics, R. P. Feynman, R. B. Leighton, and M. Sands, *The Feynman Lectures in Physics* (Addison Wesley, Reading, Mass., 1966), Vol. k1, Chap. 46, and M. O. Magnasco, Phys. Rev. Lett. 71, 1477 (1993). In addition there are interesting relationships between this model and biological systems, M. O. Magnasco, Phys. Rev. Lett. 71, 1477 (1993), and J. E. Hall, C. A. Mead, and G. Szabo, J. Membrane Biol. 11, 75 (1973) or with surface diffusion problems G. Ehrlich, F. G. Hudda, J. Chem. Phys. 44, 1039 (1966) and R. L. Schwoebel, E. J. Shipsey, J. App. Phys. 37, 3682 (1966); R. L. Schwoebel, J. Appl. Phys. 40, 614 (1969). There is agreement in that a particle, which is found in a statically nonsymmetrical potential without bias under the effect of thermal noise will not uniformly move in one direction. In the presence of fluctuating external forces with sufficiently long correlation times, however, directed movement can arise;

That means such potentials show a rectifier effect with respect to the slowly varying components of the external force. Most of the previous work in this field has concentrated upon continuous diffusion models in which the motion equations are of the Langevin equation type, M. O. Magnasco, Phys. Rev. Lett. 71, 1477 (1993), M. O. Magnasco, Phys. Rev. Lett. 72, 2656 (1994), H. X. Zhou and Y. D. Chen, Phys. Rev. Lett. 77, 194 (1996); J. E. Hall, C. A. Mead, and G. Szabo, J. Membrane Biol. 11, 75 (1973); C. R. Doering, W. Horsthemke, and J. Riordan, Phys. Rev. Lett. 72, 2984 (1994); I. Zapata, R. Bartussek, F. Sols, and P. Hanggi, Phys. Rev. Lett. 77, 2292 (1996); G. A. Cecchi and M. O. Magnasco, Phys. Rev. Lett. 76 (1968 (1996). The apparent relevance of such models to transport problems on a microscopic scale has not been treated since at least in principle a specific microscopic environment was not previously defined. The simplest microscopic model can be defined as a hop model for particles on linear chains with discrete binding locations and potential barriers therebetween.

From this point of view we have investigated the hop movement of particles in a unidimensional discrete model without inversion symmetry under the effect of an optional bias in one direction. We have given a quantitative description of the rectification effect which can arise in the region of the nonlinear response. Rectifier effects from a rate balance model for transport through channels in biological membranes which are effected through barriers have already been previously discussed G. Stark, Biochimica and Biophysica Acta 298, 323 (1973). We treat here the hopping of particles in an optional sequence of barriers and traps with periodic boundary conditions. As a consequence, our computations are also effective for periodic repetitions of potential structures without inversion symmetry. We believe that our derivation yields a microscopic description of the rectifier effect of hop movement through nonsymmetric potentials. Possible applications of a model are sketched at the end of this publication.

We hypothesize a chain which is comprised of N+1 locations $l=0, \ldots, N$ with location energies $E_l$, whereby we assume that $E_o = E_N$. In the stationary situation, the current between location l and l+1 is given by the probability low $P_l$ as $$J_l = \Gamma_{l+1,l} e^{K/2} P_l - \Gamma_{l,l+1} e^{-K/2} P_{l+1}. \quad (1)$$

$\Gamma_l+_1$, 1 is the hop rate for a transition from location 1 to location l+1, which is multiplied by a bias factor $e^{K/2}$. The rate for the reverse jump Γl+l+1 is multiplied by the inverse factor. It is assumed that an equilibrium state exists in the case of the absence of a bias. For the equilibrium state the equation for the detailed equilibrium.

$$\Gamma_{l+1,l} P_l^{eq} = \Gamma_{l,l+1} P_{l+1}^{eq} \quad (2)$$

has the equilibrium probability law expression $$P_l^{eq} = \exp(-\beta E_l) \left[ \frac{1}{N} \sum_{n=0}^{N-1} \exp(-\beta E_n) \right]^{-1}. \quad (3)$$

In the stationary situation, the current between any pair of neighboring locations must be equal, $J=J_l$ for all values of l. We express the current through the transfer rate to the right as $$\gamma_l = \Gamma_{l+1,l_l}$$

whereby we use the conditions of the detailed equilibrium (2) and introduce the relationship $P_l = P_l^{eq} h_l$ we obtain $$J = \gamma_l P_l^{eq} (e^{K/2} h_l - e^{-K/2} h_{l+1}) \quad (4)$$

From this equation the recursion relationship $$h_{l+1} = e^K h_l - \frac{J e^{K/2}}{\gamma_l P_l^{eq}}. \quad (5)$$

follows. The recursion relationship can be transformed in the following form $$h_l = e^{lK} h_o - e^{-K/2} J e^{lK} S_l, \quad (6)$$

whereby $$S_l = \sum_{n=0}^{l-1} \frac{\exp(-nK)}{\gamma_n P_n^{eq}} \quad \text{and} \quad S_0 = 0. \quad (7)$$

We eliminate $h_o$ by $S_N$. This can be achieved in that equation (6) can be given for l=N and solved for $h_o$. One can see that $h_o = h_N$ as a consequence of the periodic boundary conditions. Upon introducing the results in equation (6) and multiplying by $P_l^{eq}$, we obtain $$h_l P_l^{eq} = P_l^{eq} e^{(l-\frac{1}{2})K} J \left[ \frac{S_N}{1 - \exp(-NK)} - S_l \right]. \quad (8)$$

Equation 8 sets out the probability that particles in the stationary section will be found at location 1; this value must be normalized to unity. From the normalization conditions, the current per particle is given as follows $$J = e^{K/2} \left[ \frac{1}{1-\exp(-NK)} \sum_{l=0}^{N-1} f_l \sum_{n=0}^{N-1} \frac{1}{\gamma_n f_n} - \sum_{l=1}^{N-1} f_l \sum_{n=0}^{l-1} \frac{1}{\gamma_n f_n} \right]^{-1}. \quad (9)$$

The magnitude $f_1$ is defined by $f_l = P_l^{eq} e^{lK}$. The relationship (9) can be thought of as discrete analog of the stationary current which was described by Ambegaokar and Halperin [15] in their classic work on a driven Smoluchowski System.

A transparentized form for J can be achieved by rearranging the sums $$J = (e^{NK} - 1) \left[ \sum_{l=0}^{N-1} \frac{Y_l}{\gamma_l \exp(-\beta E_l)} \right]^{-1} \quad (10)$$

with $$Y_l = e^{(N-\frac{1}{2})K} \sum_{n=0}^{l} e^{(n-l)K - \beta E_n} + e^{-K/2} \sum_{n=l+1}^{N-1} e^{(n-l)K - \beta E_n} \quad (11)$$

whereby the last term must be zero when l=N−1. Equation (10) is the final result of the formal derivation. One can easily test, based upon simple examples whether the arrangement of the barrier energy and location energy is relevant for the magnitude of the resulting current in cases of optional bias.

The well-known result for the region of the linear response [16, 17] can easily be determined from equations (10) and (11)

$$J = K \left\{ \sum_{l=0}^{N-1} [\gamma_l P_l^{eq}]^{-1} \right\}^{-1}. \quad (12)$$

As a consequence of the detailed equilibrium, equation 12 can also be expressed through the transition rate from the left. In the region of the linear response, no rectifying effect is provided, i.e. the current 12 alternates the sign simply when the sign of K is reversed. One notes that the terms under the sum can be optionally rearranged.

Next we hypothesize the nonlinear transport in the barrier model with constant location energy $E_l = 0$ in which the transition rates are symmetrical $\Gamma_{l+1,l} = \Gamma_{l,l+1}$, compare also equation (2). From (10) and (11) we obtain directly the equation 13.

$$J = 2\sinh\left(\frac{K}{2}\left[\sum_{l=0}^{N-1} \gamma_l^{-1}\right]^{-1}\right). \quad (13)$$

which previously was derived in conjunction with transport in systems with frozen disorder R. Biller, Z.Phys.B 55, 7 (1984). Apparently even in this case the shares of the individual barriers are rearranged which implicates the absence of the rectifier effect. For the development of the rectifier effect, therefore, models are required which contain the varying location energy $E_1$.

Before we discuss the special case of rectification, note should be taken of the jump model for the current through membrane channels which have been studied in biologically moved work, B. J. Azolinski, H. Eyring, and C. E. Reese, J. Phys. Chem. 53, 1426 (1949); F. H. Johnson, H. Eyring, kand M. I. Polissar, The Kinetic Basis of Molecular Biology, (Wiley, New York, 1954), Chap. 14; P. Lauger, Biochimica et Biophysica Acta 311, 423 (1973), the boundary conditions used there are different from those used here. In the work for transport through membranes, the concentrations $P_o$ and $P_N$ on both sides of the membrane are given values which correspond to a chemical bias. In the reference (P. Lauger, Biochimica et Biophysica Acta 311, 423 (1973), the saturation effect in the passages is taken into consideration with a limitation to a maximum of particle per "channel" as the normalization. Several formal similarities between the expression for the current in (P. Lauger, Biochimica et Biophysica Acta 311, 423 (1973), and are results in the case of large concentration $P_o$ and $P_N$ when each channel is occupied by a particle.

We have undertaken a comparison of our general formula equation (10) and (11) by numerical simulations. We investigated first the model of particle diffusion in a potential in which the Schwoebel-barrier exists and which for diffusion in surfaces is relevant (G. Ehrlich, F. G. Hudda, J. Chem. Phys. 44, 1039 (1966) and R. L. Schwoebel, E. J. Shipsey, J. App. Phys. 37, 3682 (1966); R. L. Schwoebel, J. Appl. Phys. 40, 614 (1969) this model is shown in FIG. 1 (see the insert); it has no inversion symmetry. In this representation results of the numeric simulations are provided together with the analytic result from equation (10). One can see a perfect agreement between theory and simulations.

One can see that the current is linear in the bias parameter $b \equiv \exp(|K|/2)$ for $b \gg 1$. These conditions can easily be obtained from the recursion relation equation (1). We assume a bias which is so strong that the oppositely running jump process is negligible. With this assumption the recursion relation simplifies to $$J_l = \gamma_l \exp(K/2) P_l. \tag{14}$$

We take $J_l = J$ and solve the equation for $P_l$. Normalizing $P_l$ gives $$J = e^{K/2} \left[ \sum_{l=0}^{N-1} \gamma_l^{-1} \right]^{-1}. \tag{15}$$

In the region of a strong bias, the current is determined by the inverse of the sum over the inverse jump rate in the direction of the bias. When the direction is the reverse, $K<0$ and we have $$J = e^{-K/2} \left[ \sum_{l=0}^{N-1} (\gamma_l')^{-1} \right]^{-1} \tag{16}$$

whereby $\gamma_l' \equiv \Gamma_{l,l+1}$, the transition rate is toward the left. The equations (15) and (16) are shown in FIG. 1 by broken lines; the full theory and the numeric results approximate the asymptotic course.

The results for strong bias lie directly close by since a large ratio between the current to the right and to the left is achieved by the choices of a potential as indicated in the insert of FIG. 2. The currents to the left and right in such a model are determined by numeric simulation and are shown in FIG. 2 together with the complete and asymptotic results. There is agreement of the simulations with the complete results and one can see that the asymptotic condition is reached for a sufficiently strong bias.

The discrete nature of our model enables us to provide a general evaluation of the transition bias which drives the induced current and in which the equations (15) and (16) are involved. One can see that in FIGS. 1 and 2 the transition to an asymptotic behavior of large values of b for the bias direction is effected with larger currents and at smaller values of b for the opposite direction. The correction for asymptotic behavior is determined by the jump process along the chain in-which all but one jump in effected in the bias direction. If one provides all of the possibilities for no jump in the opposite direction to the bias or only a single jump in the opposite direction, conceptually, one can obtain the following current for $K>0$ $$J = e^{K/2} \left[ \sum_{l=0}^{N-1} \frac{1}{\gamma_l} + e^{-K} \sum_{l=0}^{N-1} \frac{\gamma_{l+1}'}{\gamma_l \gamma_{l+1}} \right]^{-1} \tag{17}$$

whereby $\gamma_l, \gamma_l'$ are defined above. The corresponding formula $K<0$ can be easily given. Equation (17) produces bias values in which the current amounts to 90% of the asymptotic current: for the example of FIG. 1, b=3 (current to the right), b=1.48 (current to the left) and for the example 2 b=7.31 (current to the right) b=1.53 (current to the left). The figures verify the aforedescribed.

In summary we can say that we have provided a microscopic description of the rectifying effect for the hot movement of particles through nonsymmetrical potentials under the influence of strong bias. The connection of our derivation to particle transport through channels in membranes has already been cited. We note that the use of this research is not limited to linear systems, like channels with nonsymmetrical potentials. The results can be applied also to two dimensional and three dimensional systems. For example to stepped surfaces or layered systems. When the proposed structure has an unsymmetrical potential in the x direction and periodic uniform potentials in the y direction, the results have direct application. The reason is that the jump movement of particles in these directions is independent of the x direction. When a bias in the x direction is provided, the current then has the above discussed nonlinear dependency while in the two other directions only diffusion arises. The situation would be completely different if in the structure defects are provided. Also the influence of many particles which may be in competition for the filling of the locations, is not known, see however, in this relationship (I. Derenyi and T. Vicsek, Phys. Rev. Lett. 75, 374 (1995); F. Marchesoni, Phys. Rev. Lett. 77, 2364 (1996) in which the movement of many particles is known linear potentials are hypothesized.

What is claimed is:

1. A rectifier having a rectifying effect on ion charge transport, comprising a stack of at least three layers of semiconductive material having an asymmetrical course of the equilibrium energy level for a single ion type, and electrodes connected to an electric source for applying an electric field across said stack for rectifying passage of ions of said type in said stack.

2. The ion charge transport rectifier defined in claim 1 wherein a multiplicity of said stacks are disposed between said electrodes.

3. The ion charge transport rectifier defined in claim 1 wherein said layers are formed as part of a monolayer constituting said stack.

4. The ion charge transport rectifier defined in claim 1 wherein the layers are so configured that the equilibrium energy level of a layer is not less than the equilibrium energy level of a preceding layer of the stack.

5. The ion charge transport rectifier defined in claim 1 wherein said stack is formed from semiconductive material.

6. The ion charge transport rectifier defined in claim 1 which is comprised of at least one mixed crystal having at least two crystal components.

7. The ion charge transport rectifier defined in claim 1 wherein layers of said stack have increasing contents of at least one substance determining said course of equilibrium energy levels in said stack.

\* \* \* \* \*